US007822243B2

(12) United States Patent
Demharter

(10) Patent No.: US 7,822,243 B2
(45) Date of Patent: Oct. 26, 2010

(54) METHOD AND DEVICE FOR IMAGE RECONSTRUCTION

(75) Inventor: Nikolaus Demharter, Dormitz (DE)

(73) Assignee: Siemens Aktiengesellschaft, Munich (DE)

( * ) Notice: Subject to any disclaimer, the term of this patent is extended or adjusted under 35 U.S.C. 154(b) by 1139 days.

(21) Appl. No.: 11/446,389

(22) Filed: Jun. 2, 2006

(65) Prior Publication Data

US 2006/0285733 A1    Dec. 21, 2006

(30) Foreign Application Priority Data

Jun. 2, 2005    (DE)    ........................ 10 2005 025 430

(51) Int. Cl.
*G06K 9/00* (2006.01)
(52) U.S. Cl. .......................................... 382/128; 378/4
(58) Field of Classification Search ................. 382/100, 382/128, 129, 130, 131, 132; 128/922; 378/4–27
See application file for complete search history.

(56) References Cited

U.S. PATENT DOCUMENTS

| | | | |
|---|---|---|---|
| 6,984,210 B2* | 1/2006 | Chambers et al. | ........... 600/443 |
| 7,051,309 B1* | 5/2006 | Crosetto | ....................... 716/10 |
| 7,073,158 B2* | 7/2006 | McCubbrey | ................... 716/17 |
| 2004/0060032 A1* | 3/2004 | McCubbrey | ................... 716/16 |
| 2004/0122325 A1* | 6/2004 | Chambers et al. | ........... 600/467 |
| 2006/0117164 A1* | 6/2006 | Coxe et al. | ..................... 712/15 |
| 2007/0147586 A1* | 6/2007 | Scheinman | ................... 378/57 |

OTHER PUBLICATIONS

"Tailored Utilization of Acquired k-space Points for GRAPPA Reconstruction," Qu et al, Journal of Magnetic Resonance, vol. 174 (2005) pp. 60-67.
"FPGA Computer Architectures," Perkowski, Northcon/93 Conference Record, Oct. 12-14, 1993, pp. 87-92.

* cited by examiner

*Primary Examiner*—Anand Bhatnagar
(74) *Attorney, Agent, or Firm*—Schiff Hardin LLP

(57) ABSTRACT

In a method and processing device for image reconstruction from raw data acquired with a medical imaging examination apparatus, in particular from data of magnetic resonance tomography, an algorithm to be used for the image reconstruction is loaded into at least one reprogrammable FPGA, the reprogrammable FPGA, accesses via a data connection, the acquired raw data as well as calculation parameters provided for the image reconstruction and reconstruction image data are calculated from the raw data by the FPGA, dependent on the calculation parameters.

22 Claims, 3 Drawing Sheets

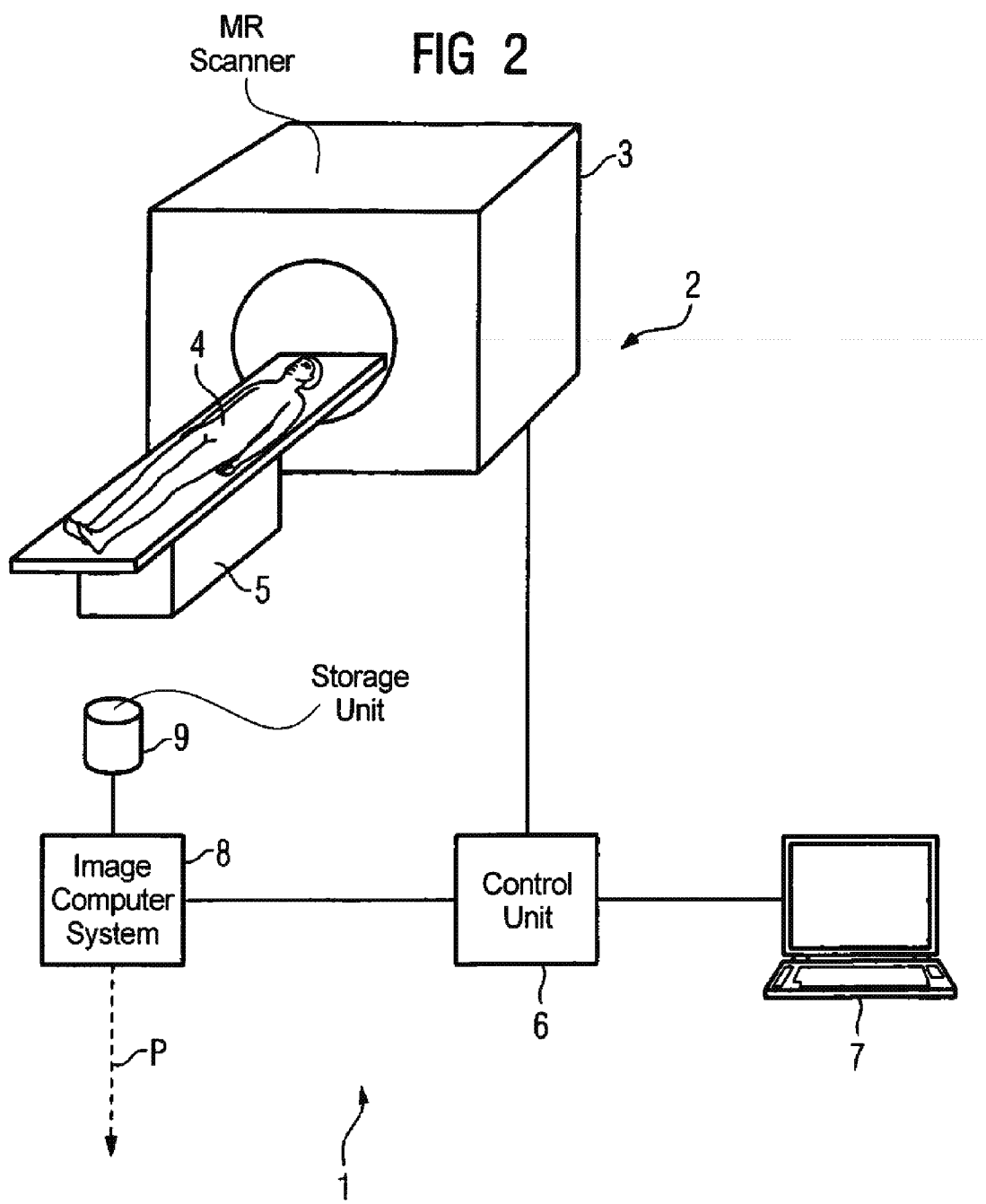

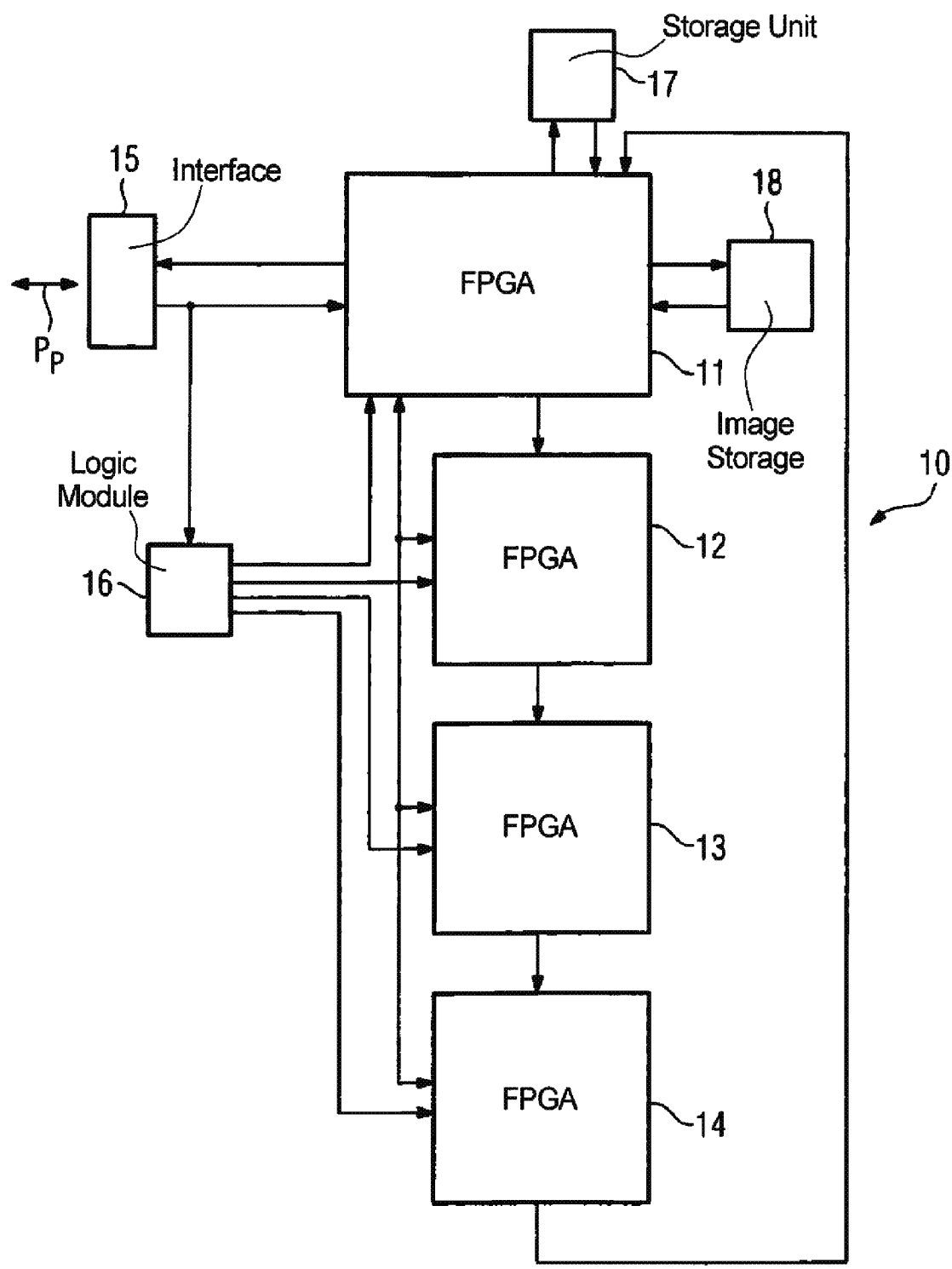

METHOD AND DEVICE FOR IMAGE RECONSTRUCTION

BACKGROUND OF THE INVENTION

1. Field of the Invention

The present invention concerns a method for image reconstruction from raw data acquired with an imaging medical examination apparatus, in particular a magnetic resonance tomography apparatus, as well as an image processing device that implements such a method.

2. Description of the Prior Art

In the use of imaging medical examination devices such as, for example, magnetic resonance tomography systems or computed tomography systems or the like, raw data are initially acquired from which images are created in the framework of an image reconstruction using software. Such images are suitable for inspection by a medical-technical assistant or doctor for further processing or evaluation.

In typical image reconstruction software available today in the medical field, the further processing of the initially present raw data has conventionally been implemented by a "general purpose" processor. Such a general purpose processor is not designed for the requirements that are specifically present in image reconstruction, such that (depending on the algorithm or algorithms used for the reconstruction) the reconstruction can take a considerable amount of time.

It is also known to implement such image reconstruction using software that executes to data calculation on dedicated processors or digital signal processors or matrix processors. Usage of such processors that are optimized (with regard to their speed) for specific tasks also enables only an insufficient utilization of the existing resources; in static systems, because the problem generally exists that such processors can inevitably utilize only a partial range of their resources for an algorithm to be executed. This leads to the situation that the image computer that is charged with the reconstruction must embody a very high number of processors, the existing logic of which is only insufficiently utilized. High costs and undesirably long wait times thereby arise for a user who would like to view the images that are not yet available during or even shortly after the examination.

SUMMARY OF THE INVENTION

An object of the present invention is to provide a method for image reconstruction as well as an associated image processing device with which an increase of the computing capacity and an optimized resource utilization are possible.

This object is achieved in accordance with the invention by a method of the aforementioned type that includes the following steps:

loading an algorithm to be used for the image reconstruction into at least one reprogrammable FPGA (field programmable gate array), with the reprogrammable FPGA, accessing via a data connection, the acquired raw data as well as calculation parameters provided for the image reconstruction, and calculating of reconstruction image data from the raw data by the FPGA, dependent on the calculation parameters.

Instead of a typical processor, a freely programmable logic circuit is thus used that can and should be repeatedly programmed without difficulty. The new configuration to be adopted is stored in corresponding storage units. In the inventive method, the need for a frequent variation of the algorithm or the algorithms to be used for the image reconstruction, for example with regard to different acquisition sequences or missing image lines (depending on the acquisition type and the like), is therewith accommodated. For example, in magnetic resonance tomography frequently varied or modified algorithms are used that are based on the GRAPPA algorithm.

Once the FPGA or a unit formed by a number of FPGAs, has been adapted to the now-current algorithm via reprogramming such that now a specific logic arranged for the task to be solved is present, calculation parameters are transferred from the primary memory of a (normally but not necessarily central) image computer to the FPGAs or FPGA unit in addition to the raw data of the examination device. The calculation parameters contain instructions transcending the raw data with regard to the implemented measurement, for example regarding the positioning and the like as well as data that, for example, concern a desired representation of the images to be created and the like. These parameters are predetermined from databanks or corresponding programs or also by a user.

The access of the FPGA or, respectively, of the multiple FPGAs to the raw data and parameters appropriately ensues via a corresponding bus system using an optimally fast storage access method.

As a result, the reconstruction from the existing data, based on the optimized embodiment of the calculation units in the form of the FPGAs, is optimally implemented as desired, for example directly with the presence of the raw data.

After the calculation of the reconstruction image data, if applicable a planned reprogramming of the FPGA is implemented. A repetition of the steps of the access to the raw data or calculation parameters as well as the calculation of the reconstruction image data follows the reprogramming.

In the inventive method, the reprogrammable FPGA (in which, for example, the algorithm to be used is loaded at the start of an acquisition sequence) can thus completely utilize its respective available resources for the calculation. If another algorithm is necessary for a subsequent examination or, respectively, image reconstruction, this can be calculated after a suitable reprogramming of the FPGA or FPGAs, for example given a system restart. The image computer system (as is present, for example, in a clinic) functions with fewer processors overall, so costs can be saved. Moreover, the images are available faster for post-processing or medical assessment. This acceleration of the image reconstruction can also be meaningful when it must be decided as quickly as possible during an examination whether a further, possibly more precise, examination or an examination concerning a different body region must be conducted. In this case, the patient does not have to wait long until the reconstructed images are available to the doctor and he or she can decide whether the examination must be continued. Finally, the efficient utilization of the examination apparatus can be improved.

The FPGA can be reprogrammed dependent on a change of the algorithm to be used. Via the reconfiguration, the FPGAs are optimally adapted to the processing of this specific algorithm, and the calculation of the magnetic resonance images or the images of another examination apparatus can begin directly with the arrival of the first raw data. Naturally, a new change of the algorithm is possible at any time as needed with a reprogramming of the FPGA.

The image data calculation can be implemented in parallel by the FPGA or the FPGAs. Given use of the FPGAs, in contrast to conventional calculation units numerous calculation steps are implemented in parallel in one clock cycle. This leads to a distinct time savings with regard to the time required overall for the calculation, in particular in connection with algorithms in which a parallel processing is possible in a particularly simple manner, since here, for example, similar or identical calculation steps must be implemented for a large data set without, for example, results of preceding calculations being necessary. Such a good parallel processing capability is provided, for example, given data from magnetic resonance tomography in connection with their processing with the GRAPPA algorithm.

The raw data and/or the calculation parameters can be stored in the primary memory of an image computer system for access. The image computer system can be formed by one or more computers, and the primary memory is formed by the working memory or working memories of the individual computers. The primary memory (normally not a permanent memory) of the image computer system receives the raw data (for example of a magnetic resonance apparatus) for buffering immediately after the acquisition thereof. The raw data or the calculation parameters additionally can be stored in a permanent storage unit such as a central image archive (often typical in clinics) when, under specific circumstances, the image reconstruction can or should be implemented only afterwards. In such a case, the inventive method naturally can be employed with its use of reprogrammable FPGAs; in this case, the time required for calculation is also shortened.

According to the invention, the image data can be stored in the primary memory of the image computer system after their calculation, in particular in response to a corresponding query. The completed calculated data are thus delivered back from the FPGA via corresponding data connections and, if applicable, after buffering in the primary memory, such that the data are available again via a conventional primary memory access, for example for a program with which the image data are shown to a user on the screen. If applicable, desired or required further processing, storage in a permanent storage, can also ensue via an access to the primary memory.

According to the invention, the access to the primary memory can be implemented as a direct memory access. By circumventing the processor or the processors of the image computer system, it is thereby possible to achieve a faster memory access, such that the total time necessary for the image data generation from the acquired data to the return delivery of the finished image data to the primary memory of an image computer system is further shortened.

According to the invention, the algorithm to be used can be loaded at the start of an image acquisition sequence. It is thus possible to change the algorithm as often as needed (for example at the start of an acquisition sequence) and to accordingly reprogram the FPGA.

The image data can be calculated basically without time delay. With the inventive method it is possible to already view finished calculated images practically "on the fly" during the time in which a measurement with a medical examination apparatus is still running and, if applicable, to adapt the implementation of the measurement dependent on the image exposures already present. For example, during the workflow of a data acquisition procedure (scan) a decision can be made about further measurements to be effected that can then immediately follow. It is also possible to detect incorrect settings or quality problems in the examination apparatus that lead to image exposures that cannot be evaluated or to image exposures that do not show the desired structures in the desired manner, such that the measurement parameters can be changed if necessary, or the measurement can be terminated. Unnecessary measurements or later repetitions of measurements are thus avoided with the use of the inventive method.

The image data can be calculated using a number of FPGAs, in particular using cascaded FPGAs and/or FPGAs in parallel. In the case of cascaded FPGAs, the image (insofar as it has already been generated) and the raw data still to be processed, or data to be processed further, are shifted from one FPGA into the next FPGA via suitable interfaces. That FPGA that is next in the series then adds its respective contribution to the image to be completed and shifts the data (already present and now to be further added to) to the following FPGA in the cascade. If the raw data or the already-generated image data have ultimately proceeded through all FPGAs in the cascade, the finished image is stored in an image storage in order to be retrievable therefrom via a bus system given the entry of an appropriate query.

By contrast, FPGAs arranged in parallel respectively calculate their contribution to the images to be created independently of one another, without accessing partial images of other FPGAs. For this purpose, it is necessary that the calculation operations to be respectively implemented at a specific point in time can be appropriately implemented well in parallel.

The most advantageous manner of the arrangement of the FPGAs to be used will depend just as much on the image reconstruction to be used as on the format and extent of the raw data. For image reconstruction, it can be meaningful to use combinations of FPGAs that are cascaded and combinations that are arranged in parallel. These differently-arranged FPGAs can be used for processing for different data or in different steps of the overall calculation.

Given usage of a number of FPGAs, at least one FPGA or part of an FPGA can control the calculation of the image data. In order to ensure an optimal resource utilization, this FPGA serving as a controller can also be used for calculation, depending on its design or depending on the calculation tasks to be fulfilled in addition. Particularly in cases in which a number of cascaded FPGAs or FPGAs arranged in parallel are used, for control it can be meaningful to use more than one FPGA that, in this case, is appropriately connected upstream from the individual units of FPGAs.

Furthermore, the invention concerns an image processing device with one or more components that each contain at least one FPGA, the image processing device being fashioned for use in the image reconstruction from raw data acquired with an imaging medical examination apparatus as explained in the preceding. The image processing device is thereby particularly suitable for image reconstruction from data of magnetic resonance tomography. The image processing device is thus connected via a data connection with an examination apparatus that includes a control unit that controls, or assists in the control of the image acquisitions that are to be implemented with the examination apparatus. In addition, a connection exists from the control unit to a screen.

The data that are acquired with the magnetic resonance tomography apparatus or with a computed tomography apparatus or a comparable examination apparatus are forwarded via the control unit (which is connected with the screen for specification of examinations to be effected or for consideration of acquired data or images by a medical-technical assistant or doctor) to an image computer system. This image computer system of the image processing device accesses storage units, in particular a primary memory, or multiple primary memories, as well as permanent storage units such as fixed discs and the like. Naturally, it is also possible for the control unit for the examination apparatus to be integrated into the image computer system or to the image processing device. The image computer system does not necessarily have to be arranged at one physical site, but can be formed by different computer units that are connected over a network.

For optimization of the image reconstruction from the raw data, the image processing device has one or more components that respectively embody one or more FPGAs that are reprogrammed depending on the type of the algorithm to be used for the image reconstruction in order to calculate the image data in an optimally fast manner and utilizes all existing resources.

The component or the components can embody multiple (in particular one through ten) FPGAs; and/or an interface with a peripheral bus of an image computer system; and/or a device for transfer of data of a peripheral bus to at least one FPGA; and/or at least one storage unit for storage of calculation parameters; and/or raw data; and/or calculated image data. Depending on the computation effort to be expended or depending on the degree of the specialization of the different calculation tasks to be fulfilled, a series of FPGAs can be used, embodied either in one component or in multiple components. There is no upper limit for the number of the FPGAs used. More than ten FPGAs can be embodied in a component or in multiple components. The individual components, which are understood in the manner of electronic modules, respectively execute specific computation steps in the course of the calculation.

Via an interface with the peripheral bus of an image computer system, it is possible to load the individual components, or the individual FPGAs of the components, from the peripheral bus, thus to forward new data with regard to the image acquisition or the algorithms from the image computer system to the FPGAs. If calculation parameters as well as other parameters and raw data are received from the peripheral bus, they are initially buffered in a special memory unit of a component (which can be a static RAM). From there, they are transferred via suitable interfaces of the FPGAs for calculation therein. If sufficient parameter data or other data exist in the FPGAs (which can be FPGAs of different types depending on the tasks to be fulfilled), the image can be reconstructed. If the image has been completely calculated in the FPGAs, it is stored in turn in a storage unit of the component, for example re-saved in a static RAM. From there the image can be transferred to the peripheral bus, if applicable after an appropriate query. If this occurs, a viewer at a screen that is connected with the image computer system or a control unit for an examination apparatus can thus view the finished image data for further processing or evaluation.

Multiple FPGAs of a component can be cascaded and/or arranged in parallel. Cascaded FPGAs of a module or component receive the image (insofar as it was already calculated by preceding FPGAs) and the raw data still to be calculated (transferred from the preceding FPGA), and relay their finished data or still-existing raw data to the next FPGA. For example, three or four FPGAs can be connected in series, with each FPGA adding its contribution to the unfinished image and forwarding this improved image. After passage through the cascaded FPGAs, the finished image is stored in turn in an image storage. FPGAs arranged in parallel can implement parallel calculation operations insofar as the underlying algorithm incapable of being conducted by means of parallel calculations. In this case, no preceding calculation results are necessary, or steps can follow from preceding calculation results that enable a parallel calculation in the next calculation stage, for which the FPGAs arranged in parallel are then used. A combination of cascaded components or a parallel arrangement of components or, if applicable, different components is possible to achieve an optimal utilization of the existing computation capacities.

Furthermore, the component or the components can embody one or more logic modules via which data can be loaded for reprogramming of the FPGA or FPGAs. Such a logic module enables, for example, a configuration download, or generally a loading of the FPGA from the peripheral bus. For example, a new algorithm can be loaded with a new configuration. The logic module is set up such that a direct connection exists from it to all FPGAs, even in the case that these are arranged cascaded. Naturally, however, it is also possible to provide a logic module for reprogramming or for other data delivery that, in addition to its connection to the peripheral bus of an image computer system, has only one output connection to some FPGAs when it is clear in advance that some FPGAs require no reprogramming or no direct bus connection.

Overall, with the inventive method and the inventive image processing device achieve an efficient utilization of the existing logic can be used for image reconstruction of images in the medical field from raw data. The downloading can proceed via a logic module, for example at the sequence start, or arbitrarily often and at a suitable point or at suitable points within a sequence.

DESCRIPTION OF THE DRAWINGS

FIG. 2 schematically illustrates an inventive image processing device for implementing the inventive method.

FIG. 3 is a block diagram of an embodiment of a component of an inventive image processing device.

DESCRIPTION OF THE PREFERRED EMBODIMENTS

Figure 1:
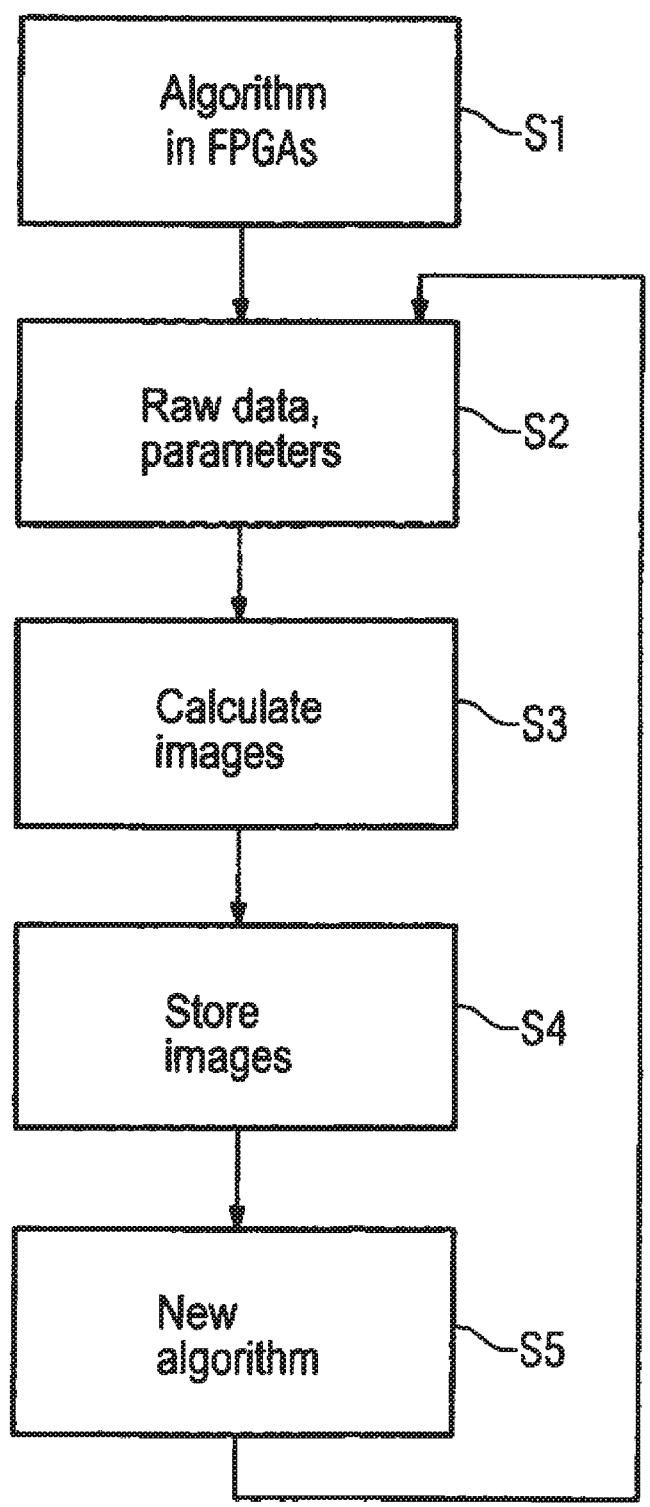
FIG. 1 is a flowchart of an embodiment of the inventive method.

FIG. 1 is a flowchart of an embodiment of the inventive method. In the inventive method for image reconstruction from raw data acquired with an imaging medical examination apparatus, in a step S1 an algorithm to be used for the image reconstruction is initially loaded in at least one reprogrammable FPGA. This loading need not necessarily ensue at the sequence start; but can ensue at any time in the course of a sequence. In step 52, the reprogrammable FPGA, or multiple reprogrammable FPGAs access the raw data acquired by the medical examination apparatus and also access parameters that have been predetermined for the image reconstruction, such as calculation parameters, which are to be understood for the present purpose in the broadest sense (thus also including parameters with regard to a desired representation format and the like). This access ensues via a data connection, preferably via an access to a peripheral bus of an image computer system or the like.

If the raw data and calculation parameters exist, these are initially buffered and are then forwarded to the FPGA or to the multiple FPGAs via corresponding interfaces of the FPGA or the multiple FPGAs, where the calculation of the reconstruction image data ensues cascaded or in parallel according to the step S3. The finished image data (which, in the normal case, were determined from the contributions of the individual FPGAs given multiple FPGAs) are stored in a storage unit in step S4, where they are available (ready for retrieval) for access by the image computer system, in particular via its peripheral bus.

Since the FPGAs are optimally designed for the calculation tasks to be fulfilled thereby, the image calculation can be very fast and ensues utilizing all available capacities, such that images can already be provided to a medical-technical assistant or, respectively, a doctor during the examination (thus virtually "on the fly"). Using such images this person can, for example, make decisions about continuation of the examination. A planned reprogramming is thus implemented. The steps S2 and so forth thus follow the step S5. A reprogramming can thus be implemented without problems with the desired frequency.

FIG. 2 shows an embodiment of an inventive image processing device 1 for use in implementing an inventive method. For this purpose, the image processing device 1 is connected with an examination apparatus 2, which is a magnetic resonance (MR) scanner 3, in this example, into which a patient on a patient bed 5 is inserted. The data acquisition procedure of the magnetic resonance scanner 3 is controlled via a control unit 6 (that is connected with a display screen 7) such that a desired image acquisition sequence is executed. The acquired raw data, together with appropriate calculation parameters that are predetermined (but also can be entered and/or changed by a user via the screen 7), are supplied via the control unit 6 to an image computer system 8. Like the control unit 6, the image computer system 8 here forms a part of the image processing device 1 and accesses the storage unit 9. The storage unit 9 represents the primary memory of the image computer system 8 (which is arbitrarily fashioned) as well as further permanent storages that are used for archiving acquired image data.

The image computer system 8 has a peripheral bus with a connection to components or modules on which embody FPGAs for the calculation of reconstruction image data from raw data and the provided parameters as this information is communicated by the control unit 6. Given a change of the algorithm to be used for the image reconstruction, the FPGAs of the components of the image computer system 8 are reprogrammed such that their capacities are respectively, optimally utilized. For this purpose, such a new algorithm is loaded into the FPGAs at the sequence start or during the execution of a sequence, for which a direct memory access to the storage unit 9 (in the form of the non-permanent primary memory) is implemented. After the calculation of the image data by the FPGAs, the image data are transferred in turn from a corresponding image storage of the component with the FPGAs into the primary memory of the image computer system 8 via the peripheral bus.

Given a new sequence start, other algorithms can be calculated after a reprogramming. The optimal utilization achieved in accordance with the invention allows the image computer system 8 to be equipped with a lower number of processors. A cost savings is hereby achieved, and in addition a higher user utility is achieved. Moreover, the images are available more quickly, ideally "on the fly". Furthermore, a connection of the image processing device 1 with further examination apparatuses (which are not shown in detail here) is indicated by the dashed arrow P. Data of other examination apparatuses can thus also be processed using the inventive image processing device 1, for which its capacities are correspondingly designed.

FIG. 3 shows an embodiment of a component 10 of an inventive image processing device with FPGAs 11 through 14. The component 10 shown here is connected via an interface 15 to a peripheral bus of an image computer in order to be able to acquire parameters and raw data from the peripheral bus. This is indicated by the arrow PP pointing in both directions. Furthermore, a logic module 16 is provided that allows the individual FPGAs 11 through 14 to be loaded from the peripheral bus. This downloading can occur without limits and at suitable points in the sequence workflow. The parameters and raw data acquired from the peripheral bus are buffered in a storage unit 17 (which is a static RAM).

The data are sequentially shifted from the storage unit 17 into the FPGAs 11 through 14, initially into the FPGA 11, via corresponding interfaces (not shown here). In the shown embodiment, the FPGA 11 fulfills the task of controlling the calculation to be effected; it does itself implement calculation operations for image reconstruction. The data are transferred from the FPGA 11 into the further FPGAs 12 through 14. If sufficient parameter data are present in the FPGAs 12 through 14, the image reconstruction can begin. The image (insofar as it has already been calculated) as well as the raw data are shifted via corresponding interfaces through the FPGAs 11 and then 12 through 14. Each of these FPGAs 11 through 14 adds its respective contribution (corresponding to its task) to the image and forwards the unfinished image with the improvement (due to the respectively implemented calculation) to the next FPGA 12, 13 or 14.

If the image is completed, it is transferred from the last of the FPGAs (here being cascaded, thus from the FPGA 14) to the FPGA 11 again, and the FPGA 11 finally effects only the storage of this finished image in an image storage 18. The finished image can be requested from this image storage 18 via the interface 15 and the FPGA 11 via the peripheral bus and is available for observation by a technical employee or a doctor on a screen that is connected directly with the computer or indirectly over a network. By the use of the FPGAs precisely programmed to the object to be achieved, the time expenditure for the image reconstruction thus can be distinctly reduced in comparison to the use of a static processor.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for reconstructing an image from raw data acquired with a medical imaging apparatus, comprising the steps of:
    loading an algorithm for image reconstruction into at least one reprogrammable FPGA;
    with a medical imaging apparatus, implementing an examination of an examination subject in the medical imaging apparatus, including executing an imaging sequence to acquire raw data from the examination subject;
    from said reprogrammable FPGA, accessing said raw data acquired with said medical imaging apparatus, as well as calculation parameters to be used in reconstructing an image from said raw data at a beginning of said imaging sequence;
    in said reprogrammable FPGA, executing said algorithm using said raw data and said calculation parameters to electronically reconstruct an image from said raw data with substantially no time delay and to generate a data file representing said image, and making said data file available from said reprogrammable FPGA during said examination procedure while the subject remains in said medical imaging apparatus; and
    continuing said examination procedure by re-programming said reprogrammable FPGA as needed.

2. A method as claimed in claim 1 comprising selectively reprogramming said reprogrammable FPGA to change said algorithm to a changed algorithm and, in said reprogrammable FPGA, calculating said image according to the changed algorithm.

3. A method as claimed in claim 1 comprising calculating said image in said reprogrammable FPGA by operating on said raw data using parallel processing.

4. A method as claimed in claim 1 comprising storing at least one of said raw data and said calculation parameters in a primary memory of an image computer system, and wherein the step of accessing said raw data and said calculation parameters from said reprogrammable FPGA comprises accessing said raw data and said calculation parameters from said primary memory.

5. A method as claimed in claim 4 comprising accessing said at lease one of said raw data and said calculation parameters from said primary memory by direct memory access to said primary memory from said reprogrammable FPGA.

6. A method as claimed in claim 1 comprising after calculating said image by said reprogrammable FPGA, transferring said image from said reprogrammable FPGA to a storage unit for storage therein, for subsequent access from said storage unit.

7. A method as claimed in claim 1 comprising loading said algorithm into a plurality of reprogrammable FPGAs, and accessing at least some of said raw data and said calculation parameters with each of said reprogrammable FPGAs, and executing at least portions of said algorithm in the respective reprogrammable FPGAs, in combination, to calculate said image.

8. A method as claimed in claim 7 comprising electronically connecting said plurality of reprogrammable FPGAs by cascading said plurality of reprogrammable FPGAs, and calculating said image in chronologically successive respective calculations in the respective cascaded reprogrammable FPGAs.

9. A method as claimed in claim 7 comprising electronically connecting said reprogrammable FPGAs in parallel, and executing simultaneous calculations in the parallel-connected reprogrammable FPGAs to calculate said image.

10. A method as claimed in claim 7 comprising using at least one reprogrammable FPGA in said plurality of reprogrammable FPGAs to control a remainder of the reprogrammable FPGAs in said plurality of reprogrammable FPGAs to calculate to said image.

11. A method as claimed in claim 7 comprising using a portion of one of said reprogrammable FPGAs in said plurality of reprogrammable FPGAs to control a remainder of the reprogrammable FPGAs in said plurality of reprogrammable FPGAs to calculate said image.

12. An image processing device for reconstructing an image from raw data acquired with a medical imaging apparatus, comprising:
at least one reprogrammable FPGA having an input for loading an algorithm for image reconstruction into said at least one reprogrammable FPGA;
a data line proceeding from a source of raw data, acquired with a medical imaging apparatus in an imaging sequence implemented in an examination procedure for an examination subject in the medical apparatus, and a source of calculation parameters, to said reprogrammable FPGA allowing accessing from said reprogrammable FPGA, of said raw data, as well as said calculation parameters to be used in reconstructing an image from said raw data at a beginning of said imaging sequence; and
said reprogrammable FPGA being configured to execute said algorithm using said raw data and said calculation parameters to electronically reconstruct an image from said raw data with substantially no time delay and to generate a data file representing said image, and to make said data file available from said reprogrammable FPGA during said examination procedure while the subject remains in said medical imaging apparatus, and to be reprogrammed during a continuation of said examination procedure.

13. An image processing device as claimed in claim 12 comprising a user interface connected to said input of said reprogrammable FPGA allowing selective reprogramming of said reprogrammable FPGA to change said algorithm to a changed algorithm, and said reprogrammable FPGA then calculating said image according to the changed algorithm.

14. An image processing device as claimed in claim 12 wherein said reprogrammable FPGA calculates said image by operating on said raw data using parallel processing.

15. An image processing device as claimed in claim 12 wherein at least one of said source of said raw and said source of said calculation parameters comprises a primary memory of an image computer system.

16. An image processing device as claimed in claim 15 wherein said reprogrammable FPGA accesses said at least one of said raw data and said calculation parameters from said primary memory by direct memory access to said primary memory from said reprogrammable FPGA.

17. An image processing device as claimed in claim 12 comprising a storage unit to which after calculating said image, said FPGA transfers said data file for storage therein, for subsequent access from said storage unit.

18. An image processing device as claimed in claim 12 comprising a plurality of reprogrammable FPGAs having respective inputs into which said algorithm is loaded, each of said reprogrammable FPGAs accessing at least some of said raw data and said calculation parameters with the respective reprogrammable FPGAs executing at least portions of said algorithm, in combination, to calculate said image.

19. An image processing device as claimed in claim 18 wherein connecting said plurality of reprogrammable FPGAs are electronically connected by cascading said plurality of reprogrammable FPGAs, and wherein the respective cascaded reprogrammable FPGAs calculate said image in chronologically successive respective calculations.

20. An image processing device as claimed in claim 18 wherein said reprogrammable FPGAs are electronically connected in parallel, and execute simultaneous calculations to calculate said image.

21. An image processing device as claimed in claim 18 wherein at least one reprogrammable FPGA in said plurality of reprogrammable FPGAs controls a remainder of the reprogrammable FPGAs in said plurality of reprogrammable FPGAs to calculate to said image.

22. An image processing device as claimed in claim 18 wherein a portion of one of said reprogrammable FPGAs in said plurality of reprogrammable FPGAs controls a remainder of the reprogrammable FPGAs in said plurality of reprogrammable FPGAs to calculate said image.

* * * * *